(12) United States Patent
Jacob et al.

(10) Patent No.: US 9,076,842 B2
(45) Date of Patent: Jul. 7, 2015

(54) FIN PITCH SCALING AND ACTIVE LAYER ISOLATION

(71) Applicant: GLOBALFOUNDRIES Inc., Grand Cayman (KY)

(72) Inventors: Ajey Poovannummoottil Jacob, Albany, NY (US); Murat Kerem Akarvardar, Saratoga Springs, NY (US); Steven John Bentley, Delmar, NY (US); Bartlomiej Jan Pawlak, Leuven (BE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 2 days.

(21) Appl. No.: 14/011,125

(22) Filed: Aug. 27, 2013

(65) Prior Publication Data

US 2015/0061014 A1    Mar. 5, 2015

(51) Int. Cl.
*H01L 21/302* (2006.01)
*H01L 21/764* (2006.01)
*H01L 29/78* (2006.01)
*H01L 21/02* (2006.01)

(52) U.S. Cl.
CPC ............ *H01L 21/764* (2013.01); *H01L 29/785* (2013.01); *H01L 21/02488* (2013.01); *H01L 21/02587* (2013.01)

(58) Field of Classification Search
CPC .............. H01L 21/0337; H01L 29/785; H01L 21/02488; H01L 21/02587
USPC .......................................................... 438/751
See application file for complete search history.

(56) References Cited

U.S. PATENT DOCUMENTS

| | | | |
|---|---|---|---|
| 5,963,811 A | 10/1999 | Chern | |
| 6,635,543 B2 | 10/2003 | Furukawa et al. | |
| 7,871,873 B2 | 1/2011 | Maszara et al. | |
| 2006/0071213 A1 | 4/2006 | Ma et al. | |
| 2007/0000897 A1 | 1/2007 | Ingle et al. | |
| 2008/0042204 A1* | 2/2008 | Cheng et al. | 257/347 |
| 2008/0227241 A1* | 9/2008 | Nakabayashi et al. | 438/150 |
| 2010/0163971 A1 | 7/2010 | Hung et al. | |
| 2013/0341724 A1* | 12/2013 | Erickson et al. | 257/368 |

* cited by examiner

*Primary Examiner* — Ajay K Arora
(74) *Attorney, Agent, or Firm* — Wayne F. Reinke, Esq.; Heslin Rothenberg Farley & Mesiti P.C.

(57) ABSTRACT

A first semiconductor structure includes a bulk silicon substrate and one or more original silicon fins coupled to the bulk silicon substrate. A dielectric material is conformally blanketed over the first semiconductor structure and recessed to create a dielectric layer. A first cladding material is deposited adjacent to the original silicon fin, after which the original silicon fin is removed to form a second semiconductor structure having two fins that are electrically isolated from the bulk silicon substrate. A second cladding material is patterned adjacent to the first cladding material to form a third semiconductor structure having four fins that are electrically isolated from the bulk silicon substrate.

19 Claims, 7 Drawing Sheets

FIN PITCH SCALING AND ACTIVE LAYER ISOLATION

BACKGROUND OF THE INVENTION

1. Technical Field

The present invention generally relates to semiconductor devices and to methods of fabricating semiconductor devices, and more particularly, to fin pitch scaling in FinFETs to double or quadruple a number of fins and electrically isolate the same.

2. Background Information

Fin Field-Effect Transistors (FinFET) devices are currently being developed to replace conventional planar metal oxide semiconductor field-effect transistors (MOSFETs) in advanced complementary metal oxide semiconductor (CMOS) technology due to their improved short-channel effect immunity and higher on-current to off-current ratio ($I_{on}/I_{off}$). As is known, the term "fin" refers to a raised semiconductor structure with respect to the substrate, typically a vertical structure within or upon which are formed, for instance, one or more FinFETs or other fin devices, such as passive devices, including capacitors, diodes, etc.

Further enhancements in fin device structures and fabrication methods therefor continue to be pursued for enhanced performance and commercial advantage.

SUMMARY OF THE INVENTION

The shortcomings of the prior art are overcome and additional advantages are provided through the provision, in one aspect, of a method of facilitating channel isolation and fin pitch scaling. The method includes providing a first semiconductor structure, the first structure including a semiconductor substrate of a bulk semiconductor material, and one or more original semiconductor fins coupled directly to the substrate, and creating a dielectric layer over open areas of the substrate adjacent the one or more original fins. The method further includes creating a first cladding over the dielectric layer adjacent each of the one or more original fins, the first cladding having uniform sidewalls and including a semiconductor material sufficiently different from that of the one or more original fins to allow selective etching thereof, and selectively etching to remove the one or more original fins, resulting in a second semiconductor structure, wherein the first cladding forms second fins and the dielectric layer provides electrical isolation of the second fins from the substrate.

These, and other objects, features and advantages of this invention will become apparent from the following detailed description of the various aspects of the invention taken in conjunction with the accompanying drawings.

DETAILED DESCRIPTION OF THE INVENTION

Figure 1:
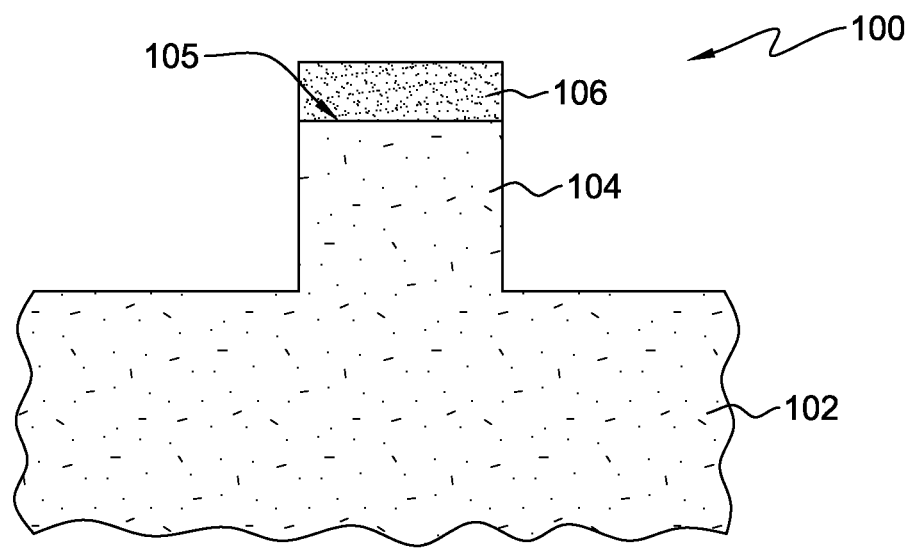
FIG. 1 is a cross-sectional elevational view of one example of an intermediate semiconductor structure, including an original semiconductor fin with a hard mask, the original semiconductor fin coupled to a semiconductor substrate, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a cross-sectional elevational view of one example of an intermediate semiconductor structure, generally denoted by 100, obtained at an intermediate stage of semiconductor fabrication processing. At the stage of fabrication, depicted in FIG. 1, the intermediate semiconductor structure 100 includes a substrate 102, such as a bulk semiconductor material, for example, a bulk silicon wafer in a crystalline structure with any suitable crystallographic orientation. Suitable orientations include, for example, (100) and (110) orientations. In the present example, the substrate has a planar (100) crystallographic surface orientation (referred to as (100) surface), which may have been rotated to about 45° angle, and may also include a notch (not shown) at an edge of the wafer, along any suitable direction such as, for example, <100> direction. In another example, the substrate may have a planar (110) crystallographic surface orientation, and where the substrate is a wafer, may further include a notch (not shown) at an edge of the wafer, along any suitable direction, such as, for example, <110> (most popular). It may be noted that the crystal direction is indicated by <100>, and the crystal surface is denoted by (100). In one example, substrate 102 may include any silicon-containing substrate including, but not limited to, silicon (Si), single crystal silicon, polycrystalline Si, amorphous Si, silicon-on-nothing (SON) and the like. Substrate 102 may in addition or instead include various isolations, dopings and/or device features.

Continuing with FIG. 1, the intermediate semiconductor structure 100 may include one or more fins (hereafter referred to as original semiconductor fin 104) coupled to the substrate 102. As one skilled in the art will know, where the substrate is a semiconductor wafer including an orientation notch (in <110> or <100> directions), original semiconductor fin 104 may be positioned substantially parallel or perpendicular to the direction as defined by the notch (or flat) pointing to <110> or <100> direction. Further, original semiconductor fin 104 may exhibit a rectangular shape with a top surface thereof having a (110) crystallographic surface orientation and a (100) crystallographic surface for the sidewall surfaces, in the case where the notch points to the <110> direction. Alternatively, the crystallographic orientation of the top surface and the sidewall surfaces of original semiconductor fin 104 may include a (100) surface orientation, in the case of the substrate including a notch aligned toward the <100> direction, where the semiconductor wafer has been rotated at an angle of about 45°.

Referring still to FIG. 1, a hard mask 106 may be deposited over original semiconductor fin 104 using conventional deposition processes, such as Chemical Vapor Deposition (CVD), Atomic Layer Deposition (ALD) or Physical Vapor Deposition (PVD). This hard mask 106 may be used, in part, to preserve the patterning of smaller features than can be preserved using an organic etch mask alone. Although hard mask 106 may include materials such as metal, spin-on organic material, silicon dioxide ($SiO_2$), silicon carbide (SiC), tetraethyl orthosilicate (TEOS), silicon carbon nitride (SiCN), silicon oxy nitride (SiON), spin-on glass (SOG), or any combinations thereof, in one example, the hard mask material may be a nitride material, such as silicon nitride ($Si_3N_4$ or SiN). Alternatively, in another example, intermediate semiconductor structure 100 may also include an original semiconductor fin without the hard mask provided over the upper surfaces.

Figure 2:
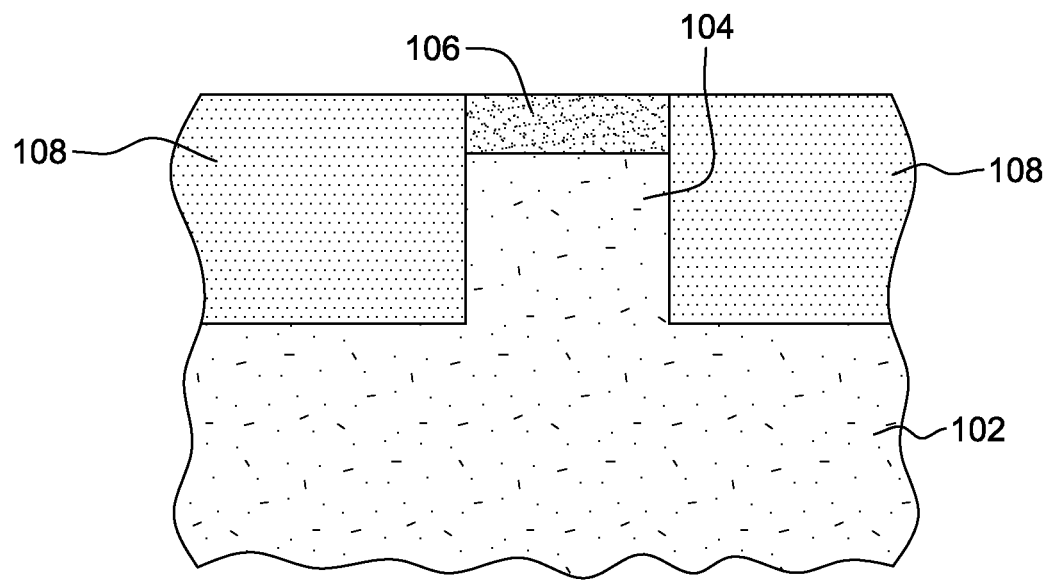
FIG. 2 depicts one example of the intermediate structure of FIG. 1 with a dielectric material having been provided adjacent to the original semiconductor fin, in accordance with one or more aspects of the present invention.

A dielectric material 108 may conformally be deposited over open areas of substrate 102, adjacent to original semiconductor fin 104, as depicted in FIG. 2. As one example, dielectric material 108 may be or include an organic material such as, a field oxide of relatively low quality within the spectrum of available oxides. For instance, the field oxide may include a flowable oxide such as, for example, a hydrogen silsesquioxane polymer or a carbon-free silsesquioxane polymer, which may be deposited as the dielectric material 108 by flowable chemical vapor deposition (F-CVD). In another example, dielectric material 108 may include, but is not limited to, silicon oxide ($SiO_2$), fluorinated silicate glass (FSG), or a high aspect ratio oxide (HARP oxide), and may be deposited using any conventional deposition processes. In one example, the height of the dielectric material deposited may correlate, for instance, to the height of original semiconductor fin 104 plus the thickness of hard mask 106 deposited over the original semiconductor fin.

Figure 3:
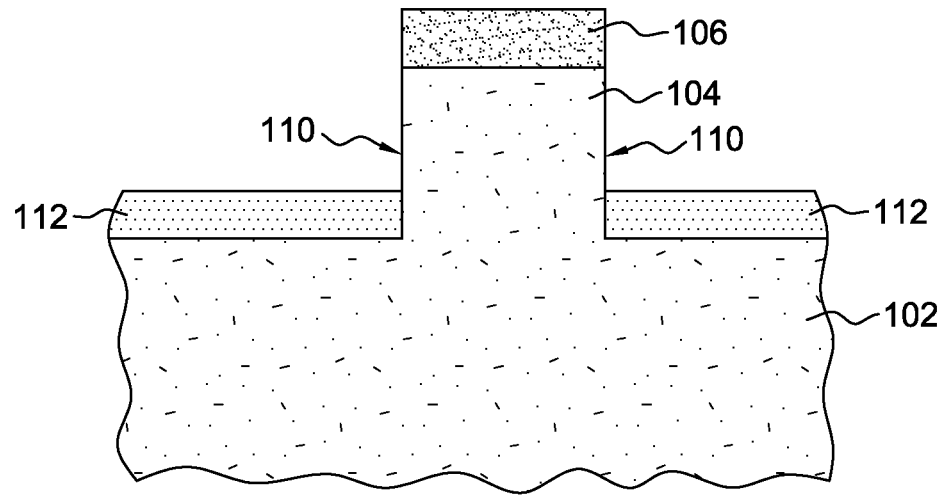
FIG. 3 depicts one example of the intermediate structure of FIG. 2 after partially recessing the dielectric material adjacent to the original semiconductor fin, in accordance with one or more aspects of the present invention.

Referring to FIG. 3, a portion of dielectric material 108 (see FIG. 2) is partially recessed, in order to partially expose the sidewalls 110 of original semiconductor fin 104 and to create a recessed dielectric layer 112. The dielectric material may be recessed using conventional isotropic or anisotropic dry-etching processes such as, reactive ion etching or plasma etching. In one specific example, reactive ion etching may be performed using remote plasma involving process gases such as nitrogen trifluoride ($NF_3$) and hydrogen ($H_2$). In one example, dielectric material 108 of FIG. 2, may be recessed to a thickness of dielectric layer 112 of about 10 nanometers to about 60 nanometers.

Figure 4:
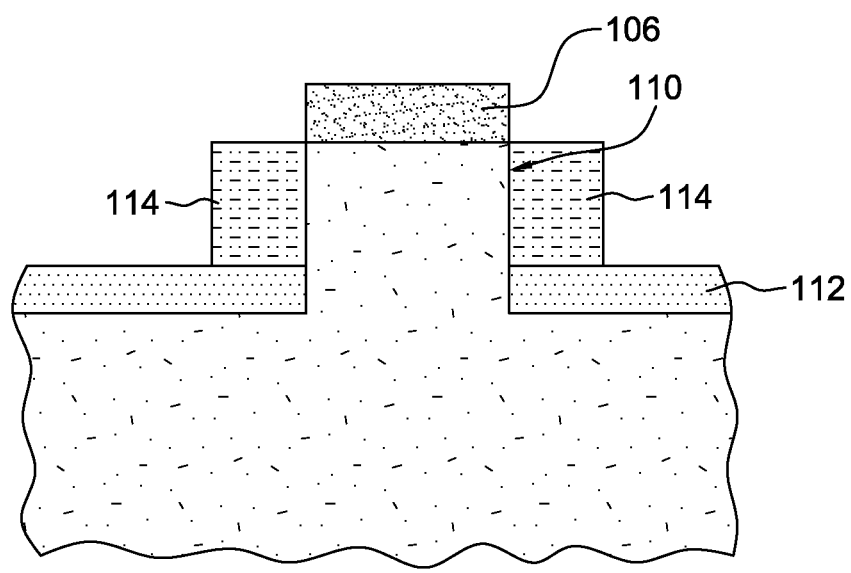
FIG. 4 depicts one example of the intermediate structure of FIG. 3 with a first cladding having been provided around the original semiconductor fin, and over the recessed dielectric material, in accordance with one or more aspects of the present invention.

As depicted in FIG. 4, a first cladding material 114 may be provided along the exposed sidewalls 110 of original semiconductor fin 104. Note the first cladding material is deposited over the upper surface of dielectric layer 112 and has uniform sidewalls. Note also that hard mask 106 prevents first cladding material 114 from being deposited on the upper surface of the fin, due to the selectivity of hard mask material. In one example, first cladding material 114 may be sufficiently different from that of the original semiconductor fin so as to allow etch selectivity, during the subsequent etching process of the original semiconductor fin.

In one example, original semiconductor fin 104 may include an undoped silicon material, and first cladding material 114 may include a heavily doped silicon. The dopant employed may be a p-type dopant or an n-type dopant. Note that as used herein, p-type dopant refers to the addition of an impurity to the silicon material of first cladding material 114 to create deficiencies of valence electrons. Examples of a p-type dopant may include boron, aluminum, gallium or indium, being added to the silicon material of first cladding material 114. The n-type dopant refers to the addition of impurities to the silicon material of first cladding material 114, which contribute more electrons to first cladding material 114, and may include, for example, phosphorus, antimony, or arsenic.

In another example, the semiconductor material of first cladding material 114 may include one or more elements from columns III, IV and/or V of the periodic table, or compounds thereof. In a specific example, the semiconductor material of first cladding material 114 may include at least one of Ge, $Si_{1-x}Ge_x$, GaAs, InP, $In_{1-x}Ga_xAs$, $In_{1-x}Ga_xSb$, $In_xGa_{1-x}As_ySb_{1-y}$, $Al_xGa_{1-x}As_ySb_{1-y}$, InSb, InAs, GaP and GaSb, and wherein $0 > x \geq 1$ and $0 \geq y \geq 1$. In such an example, the material of original semiconductor fin may include silicon, more particularly, the material of original semiconductor fin may include undoped silicon. In one example, first cladding material 114 may be epitaxially grown using conventional processes such as, for example, metal organic chemical vapor deposition (MOCVD) or molecular beam epitaxy (MBE). In another example, first cladding material 114 may be deposited using conventional deposition processes such as, for example, chemical vapor deposition (CVD), atomic layer deposition (ALD) or plasma-enhanced CVD (PE-CVD).

Figure 5:
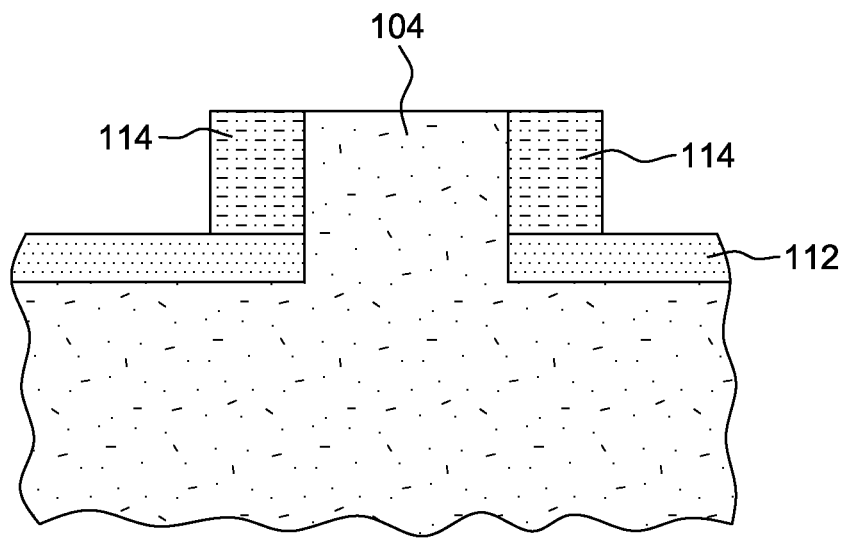
FIG. 5 depicts one example of the intermediate structure of FIG. 4 after selectively removing the hard mask to expose the original semiconductor fin, in accordance with one or more aspects of the present invention.

Referring to FIG. 5, hard mask 106 of FIG. 4 is selectively etched from the upper surface of original semiconductor fin 104 to expose the original semiconductor fin for subsequent removal processes. It should be noted that in the case where the hard mask is absent, there would instead be an etch of the first cladding material from the top surface of the fin. In that case, the first cladding material may be sufficiently different from the material of the original fin to allow for selective etching thereof. Returning to FIG. 5, note also that the etching processes performed to remove hard mask 106 advantageously facilitates in leaving first cladding material 114 along the sidewalls of original semiconductor fin 104. In one example, hard mask 106 may be selectively etched using conventional isotropic or anisotropic dry-etching processes such as, reactive ion etching or plasma etching. In one specific example, reactive ion etching may be performed using remote plasma involving process gases such as nitrogen trifluoride ($NF_3$) and hydrogen ($H_2$).

Figure 6:
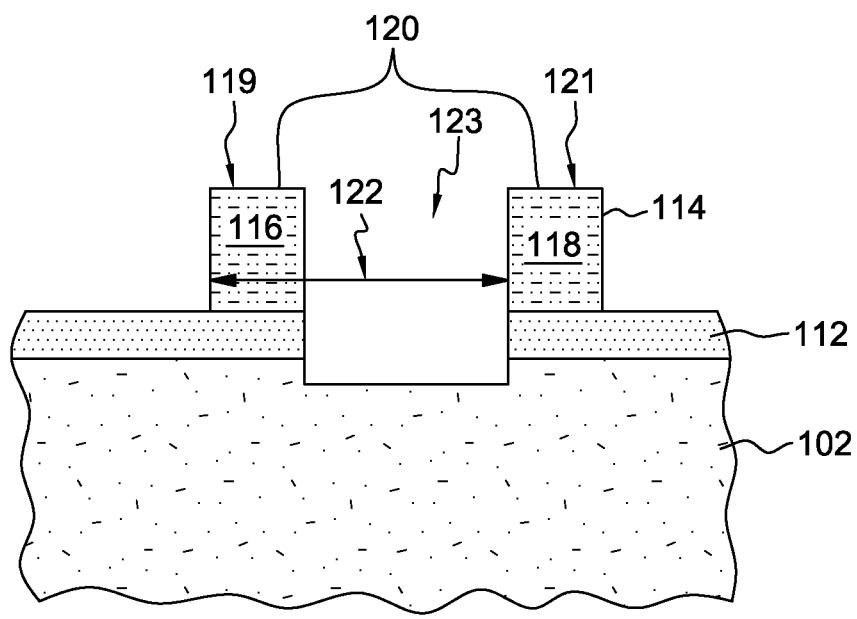
FIG. 6 depicts one example of an intermediate structure of FIG. 5, after etching to remove the exposed original semiconductor fin, and leaving the first cladding to create a second semiconductor structure, in accordance with one or more aspects of the present invention.

Original semiconductor fin 104 of FIG. 5 is next selectively etched to create a second semiconductor structure, as depicted in FIG. 6. Note that the selective etching of the original semiconductor fin advantageously facilitates in leaving first cladding material 114 to create two new fins 120, e.g., new fins 116 and 118 from the first cladding material, the two new fins being dielectrically isolated from substrate 102 by dielectric layer 112. A fin pitch 122 now exists from removal of the original fin (now empty space 123). Note also that the height of empty space 123 created by etching of original semiconductor fin 104 is arbitrary and may extend into substrate 102 as shown, or at or above a top surface of the substrate. Note also that, as discussed above in connection with FIG. 4, the etch selectivity between the original semiconductor fin and first cladding material is determined by the difference in their materials. In a specific example, the material of the original semiconductor fin may include undoped silicon while the material of first cladding material 114 may include doped silicon that has been doped with an n-type dopant or a p-type dopant. In another specific example, the material of the original semiconductor fin may include doped silicon that has been doped with an n-type dopant or a p-type dopant while the material of first cladding material 114 may include undoped silicon. Note that new fins 120 have a uniform sidewall crystal orientation. In one example, new fins 120 may exhibit a rectangular shape with top surfaces 119 and 121 having a (110) crystallographic surface orientation and a (100) crystallographic surface for the sidewall surfaces in the case of the substrate notch pointing to the <110> direction. Alternatively, the crystallographic orientation of the top surfaces and the sidewall surfaces of new fins 120 may include a (100) surface orientation, in the case of the substrate including a notch aligned toward <100> direction. Any suitable etching processes, for example, anisotropic dry etching processing and/or reactive ion etching, may be employed to selectively remove the original semiconductor fin. In this implementation, the number of fins is doubled.

Figure 7:
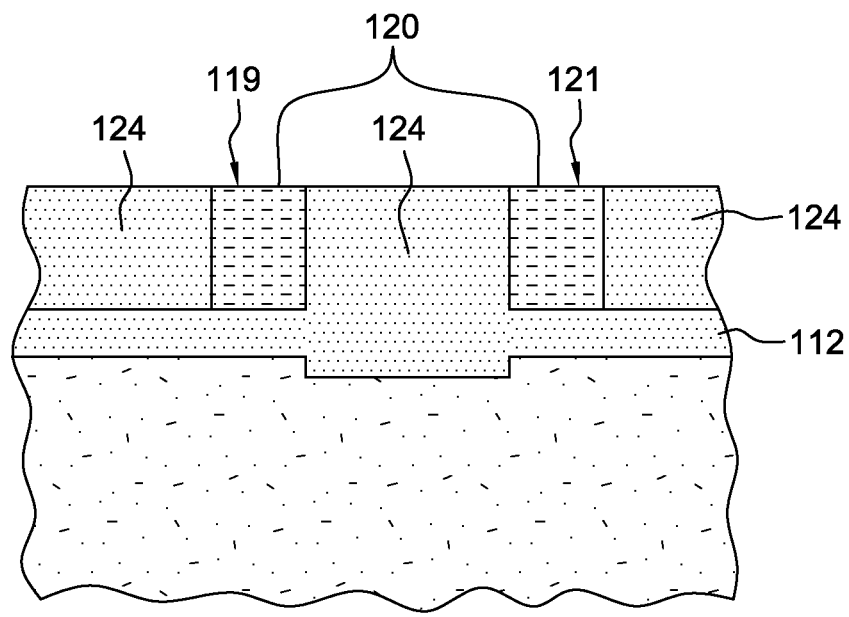
FIG. 7 depicts one example of the intermediate structure of FIG. 6 conformally blanketed with the dielectric material, in accordance with one or more aspects of the present invention.

FIG. 7 depicts the structure of FIG. 6 after conformal deposition of additional dielectric material 124. Note that the additional dielectric material 124 is conformally deposited within empty space 123 (see FIG. 6) created by etching the original semiconductor fin. As one example, additional dielectric material 124 may be or include an organic material similar to the material of dielectric layer 112, the organic material being a field oxide of relatively low quality within the spectrum of available oxides. For instance, the field oxide may include, a flowable oxide such as, for example, a hydrogen silsesquioxane polymer or a carbon-free silsesquioxane polymer, which may be deposited as additional dielectric material 124 by flowable chemical vapor deposition (F-CVD). In another example, additional dielectric material 124 may include, but not limited to, silicon oxide ($SiO_2$), fluorinated silicate glass (FSG), or a high aspect ratio oxide (HARP oxide), and may be deposited using any known deposition processes. In one example, the height of the additional dielectric material deposited may correlate, for instance, to the height of new fins 120 of the second semiconductor structure. A non-selective chemical-mechanical polish or an etch-back may be employed to polish away excess additional dielectric material 124 with the chemical-mechanical polishing terminating, for instance, at top surfaces 119 and 121 of new fins 120, where the top surfaces have been used as an etch stop.

Figure 8:
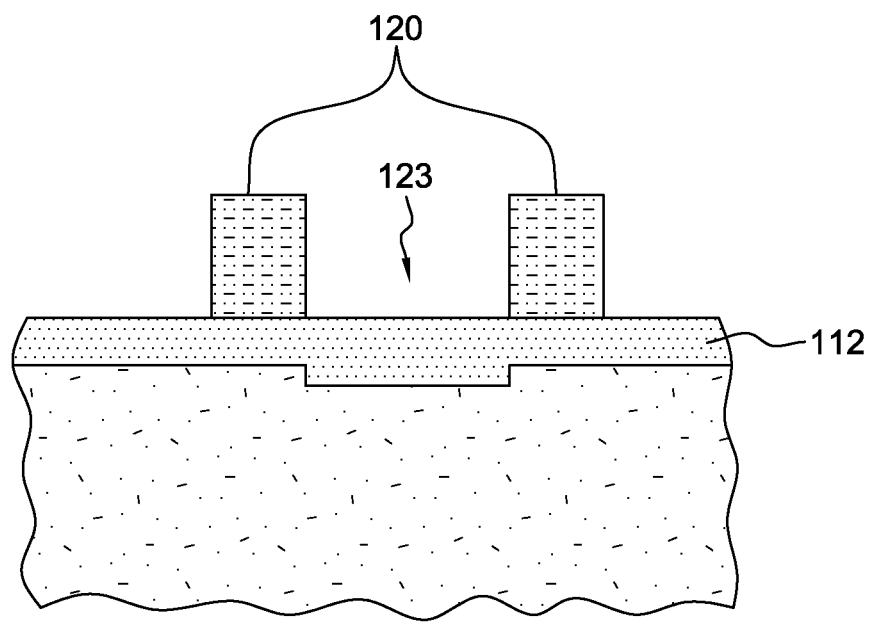
FIG. 8 depicts one example of the intermediate structure of FIG. 7 after partially recessing the dielectric material to reveal two new fins dielectrically isolated from the substrate, in accordance with one or more aspects of the present invention.

Referring to FIG. 8, additional dielectric material 124 (see FIG. 7) is partially recessed to again expose the fins, effectively extending dielectric layer 112 across the structure. Note that partial recessing advantageously facilitates in leaving a portion of additional dielectric material 124 in space 123 created by etching of original semiconductor fin 104 (see FIG. 5). Note also that the partial recessing in this example is down to a bottom surface of new fins 120. The additional dielectric material may be recessed using conventional isotropic or anisotropic dry-etching processes such as, reactive ion etching or plasma etching. In one specific example, reactive ion etching may be performed using remote plasma involving process gases such as nitrogen trifluoride ($NF_3$) and hydrogen ($H_2$).

Figure 9:
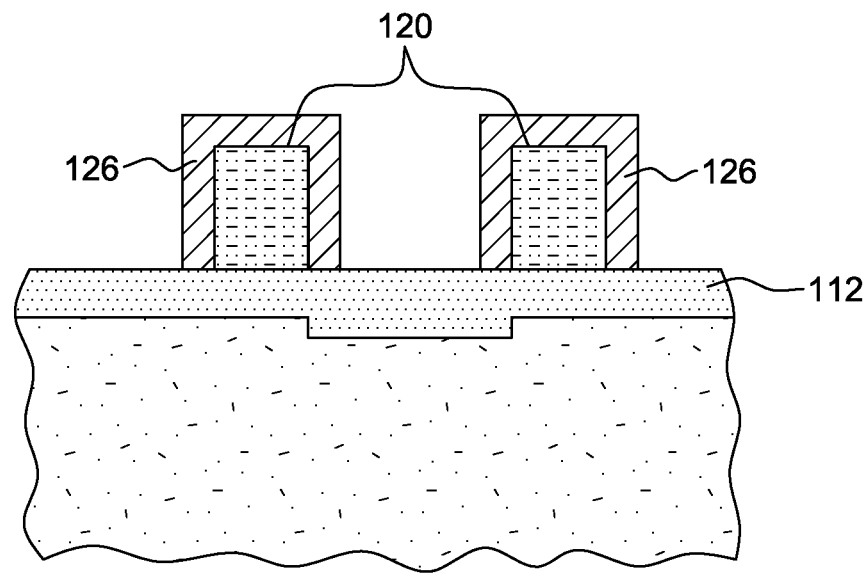
FIG. 9 depicts one example of the intermediate structure of FIG. 8 with a second cladding having been provided around the new fins, in accordance with one or more aspects of the present invention.

As depicted in FIG. 9, a second cladding material 126 may be provided around new fins 120 of the second semiconductor structure. Note the second cladding material is deposited over the top surfaces and along the sidewalls of new fins 120, which sidewalls are uniform. In one example, the second cladding material 126 may be sufficiently different from that of new fins 120 so as to allow etch selectivity, during the subsequent etching process of new fins 120. In one example, the new fins may include an undoped silicon material, and the second cladding material 126 may include silicon that has been doped sufficiently to allow selective etching. The dopant employed may be a p-type dopant or an n-type dopant. Note that as used herein, "dopant" refers to the addition of an impurity to the silicon material of first cladding material 114. Where the dopant is p-type, a deficiency of valence electrons results. Examples of a p-type dopant may include boron, aluminum, gallium or indium, being added to the silicon material of second cladding material 126. Where the dopant is n-type, the result is the contribution of more electrons to second cladding material 126, which may include, for example, phosphorus, antimony, or arsenic.

In another example, the semiconductor material of second cladding material 126 may also include one or more periodic table elements of columns III, IV and V or compounds thereof. In a specific example, the semiconductor material of second cladding material 126 may include at least one of Ge, $Si_{1-x}Ge_x$, GaAs, InP, $In_{1-x}Ga_xAs$, $In_{1-x}Ga_xSb$, $In_xGa_{1-x}As_ySb_{1-y}$, $Al_xGa_{1-x}As_ySb_{1-y}$, InSb, GaP and GaSb, and wherein $0>x\geq 1$ and $0\leq y\leq 1$. In such an example, the material of new fins 120 may include silicon, more particularly, the material of new fins 120 may include undoped silicon. In one example, second cladding material 126 may be epitaxially grown using any conventional processes such as, for example, metal organic chemical vapor deposition (MOCVD) or molecular beam epitaxy (MBE). In another example, second cladding material 126 may be deposited using conventional deposition processes such as, for example, chemical vapor deposition (CVD), atomic layer deposition (ALD) or plasma-enhanced CVD (PE-CVD). In one example, the thickness of second cladding material 126 along the sidewalls of two new fins 120 may be about 3 nanometers to about 10 nanometers. In a specific example, the thickness of second cladding material 126 along the sidewalls of two new fins 120 may be about 5 nanometers.

Figure 10:
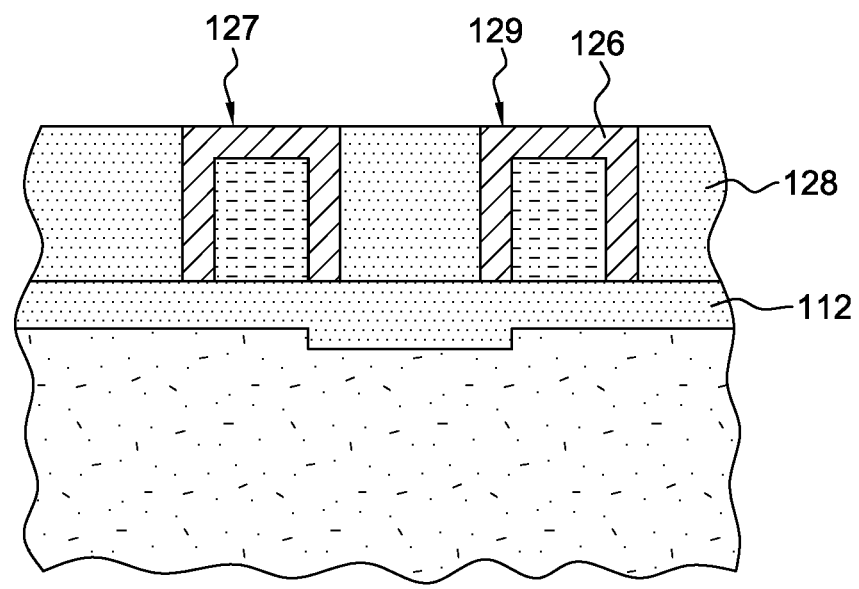
FIG. 10 depicts one example of the intermediate structure of FIG. 9 conformally blanketed with the dielectric material, in accordance with one or more aspects of the present invention.

As shown in FIG. 10, additional dielectric material 128 may conformally be deposited over second cladding material 126 surrounding new fins 120, and covering extended dielectric layer 112, as depicted in FIG. 10. As one example, additional dielectric material 128 may be or include an organic material similar to the material of dielectric layer 112, the organic material being a field oxide of relatively low quality within the spectrum of available oxides. For instance, the field oxide may include a flowable oxide such as, for example, a hydrogen silsesquioxane polymer or a carbon-free silsesquioxane polymer, which may be deposited as additional dielectric material 128 by flowable chemical vapor deposition (F-CVD). In another example, additional dielectric material 128 may include, but is not limited to, silicon oxide ($SiO_2$), fluorinated silicate glass (FSG), or a high aspect ratio oxide (HARP oxide), and may be deposited using any conventional deposition processes. A non-selective chemical-mechanical polish or an etch-back may be employed to polish away excess additional dielectric material 128 with the chemical-mechanical polishing terminating, for instance, at top surfaces 127 and 129 of second cladding material 126, the top surfaces having been used as an etch stop. In one example, the height of the additional dielectric material deposited may correlate, for instance, to the top surfaces of second cladding material 126.

Figure 11:
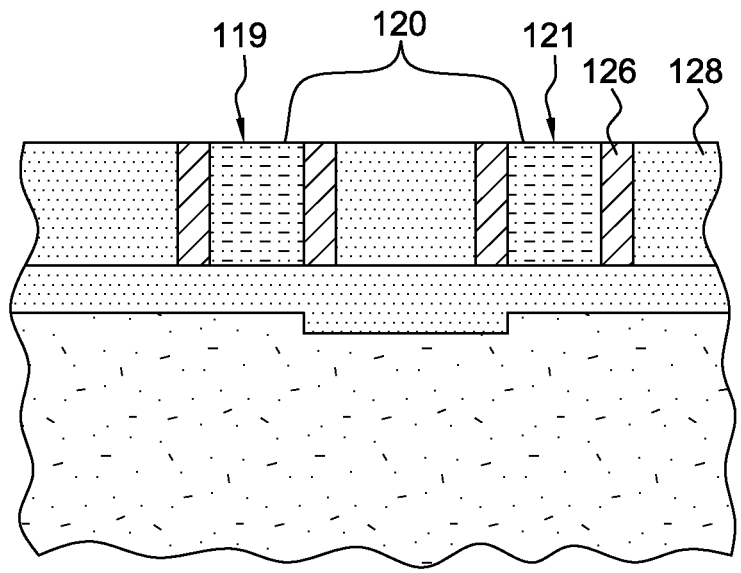
FIG. 11 depicts one example of the intermediate structure of FIG. 10 after partially recessing the dielectric material and etching the second cladding from top surfaces of the new fins, thus exposing the new fins, in accordance with one or more aspects of the present invention.

As illustrated in FIG. 11, a selective etching process may be performed to selectively etch second cladding material 126 from top surfaces 119 and 121 of new fins 120 to expose the new fins for subsequent removal. Note that the etching process performed to selectively remove the second cladding material from the top surfaces of the new fins advantageously facilitates leaving second cladding material 126 along the sidewalls of the fins. In one example, the second cladding material 126 on top may be selectively etched using conventional isotropic or anisotropic dry-etching processes, such as, for example, reactive ion etching or plasma etching. In one specific example, reactive ion etching may be performed using remote plasma involving process gases such as nitrogen trifluoride ($NF_3$) and hydrogen ($H_2$). In an another specific example, plasma-based dry etching may be performed using process gases such as sulfur hexafluoride ($SF_6$), hydrogen ($H_2$) and tetrafluoromethane ($CF_4$).

Figure 12:
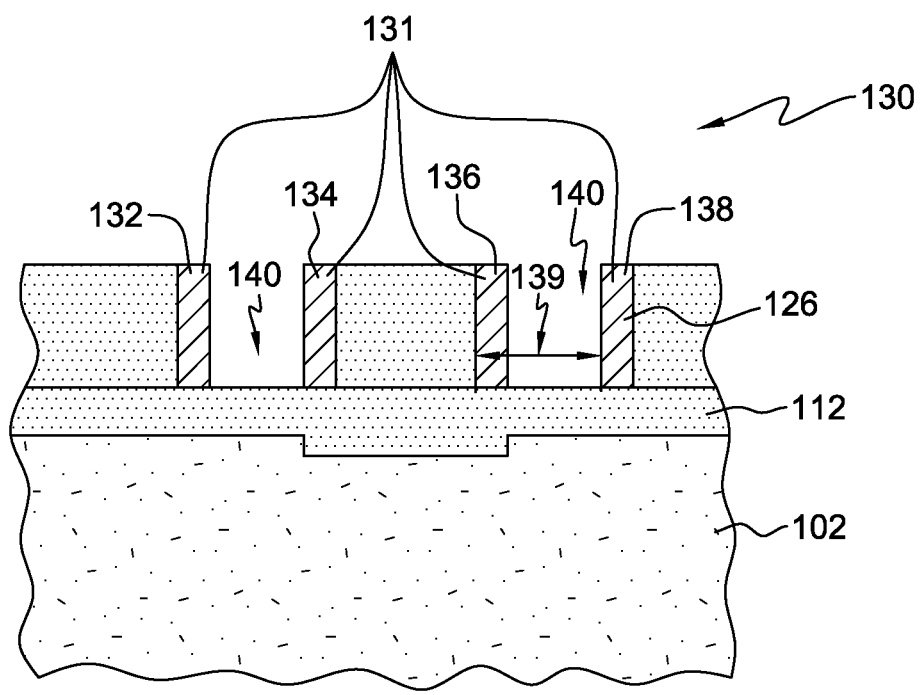
FIG. 12 depicts one example of the intermediate structure of FIG. 11 after etching to remove the new fins, creating a third semiconductor structure, in accordance with one or more aspects of the present invention.

As depicted in FIG. 12, new fins 120 of FIG. 11 are selectively etched to create a third semiconductor structure 130. Note that the selective etching to remove new fins 120 (see FIG. 11) advantageously results in the remaining second cladding material 126 creating additional fins 131, e.g., additional fins 132, 134, 136 and 138 from the second cladding material, the additional fins being separated by a distance 139 (i.e., fin pitch) within now empty space 140, and dielectrically isolated from substrate 102 by dielectric layer 112. Note also that, as discussed above in connection with FIG. 9, the etch selectivity is determined by the difference in the material of new fins 120 of FIG. 9 and second cladding material 126 (now additional fins 131). In a specific example, the material of two new fins 120 may include undoped silicon, while the material of second cladding material 126 may include doped silicon that has been doped with an n-type dopant or a p-type dopant. In another specific example, the material of the two new fins may include doped silicon that has been doped with an n-type dopant or a p-type dopant, while the material of second cladding material 126 may include undoped silicon. Note that additional fins 131 have a uniform sidewall crystal orientation. In one example, additional fins 131 may exhibit a rectangular shape with the top surfaces thereof having a (110) crystallographic surface orientation and a (100) crystallographic surface for the sidewall surfaces in the case of the substrate notch pointing to the <110> direction. Alternatively, the crystallographic orientation of the top surfaces and sidewall surfaces of additional fins 130 may include a (100) surface orientation, in the case of the substrate including a notch aligned toward the <100> direction. Any suitable etching processes, for example, anisotropic dry etching processing and/or reactive ion etching, may be employed to selectively remove the two new fins.

Figure 13:
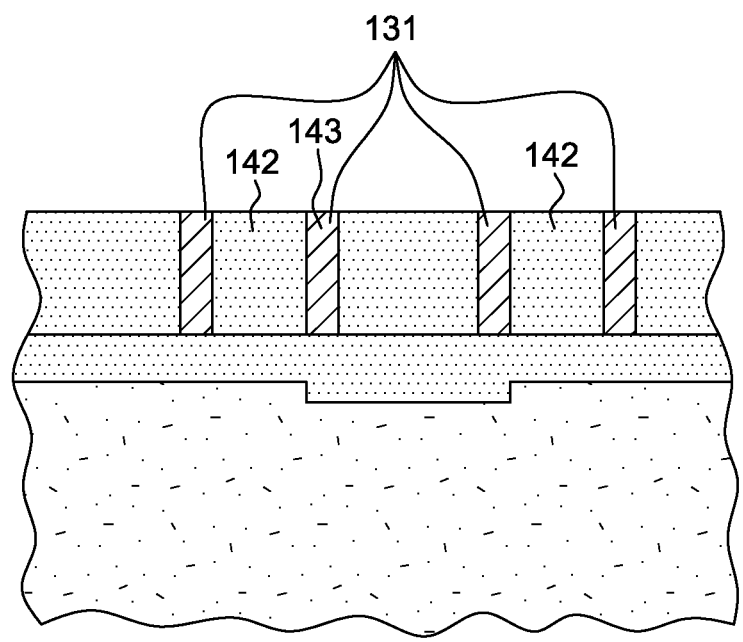
FIG. 13 depicts one example of the intermediate structure of FIG. 12 conformally blanketed with the dielectric material, in accordance with one or more aspects of the present invention.

FIG. 13 depicts an additional dielectric material 142 conformally deposited over the third semiconductor structure 130 of FIG. 12. Note that the deposition of additional dielectric material 142 includes empty spaces 140 (see FIG. 12) created by the removal of fins 120. As one example, additional dielectric material 142 may be or include an organic material similar to the material of dielectric layer 112, the organic material being a field oxide of relatively low quality within the spectrum of available oxides. For instance, the field oxide may include, a flowable oxide such as, for example, a hydrogen silsesquioxane polymer or a carbon-free silsesquioxane polymer, which may be deposited as additional dielectric material 124 by flowable chemical vapor deposition (F-CVD). In another example, additional dielectric material 142 may include, but not limited to, silicon oxide ($SiO_2$), fluorinated silicate glass (FSG), or a high aspect ratio oxide (HARP oxide), and may be deposited using any known deposition processes. In one example, the height of the additional dielectric material deposited may correlate, for instance, to the height of additional fins 130 of the third semiconductor structure. A non-selective chemical-mechanical polish or an etch-back may be employed to polish away excess additional dielectric material 142 with the chemical-mechanical polishing terminating, for instance, at top surfaces 143 of additional fins 131, where the top surfaces have been used as an etch stop.

Figure 14:
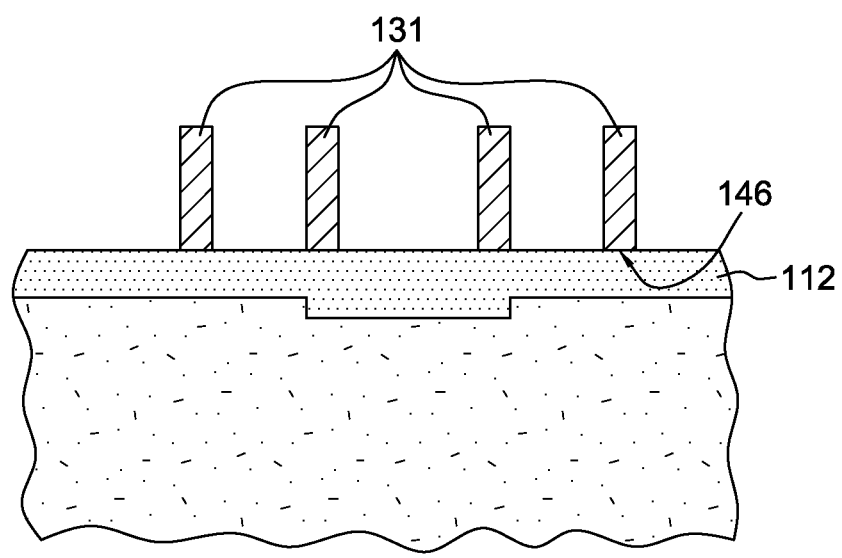
FIG. 14 depicts one example of the intermediate structure of FIG. 13 after partially recessing the dielectric material to reveal additional fins dielectrically isolated from the substrate, in accordance with one or more aspects of the present invention.

Referring to FIG. 14, the additional dielectric material 142 (see FIG. 13) is partially recessed to expose the additional fins 131 of the third semiconductor structure 130 from FIG. 12. Note also that partially recessing of additional dielectric material 142 of FIG. 13 is performed to recess the dielectric material down to bottom surfaces 146 of additional fins 131. The additional dielectric material may be recessed using conventional isotropic or anisotropic dry-etching processes such as, reactive ion etching or plasma etching. In one specific example, reactive ion etching may be performed using remote plasma involving process gases such as nitrogen trifluoride ($NF_3$) and hydrogen ($H_2$). In this implementation, additional fins 131 advantageously result in fin quadrupling as compared to the original fin, the additional fins also being dielectrically isolated by dielectric layer 112. Note that fin pitch (also referred to distance between the additional fins) is less than the fin pitch of the two new fins. Note also that the additional fins are approximately equidistant from each other.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
    providing a first semiconductor structure, the first structure comprising a semiconductor substrate of a bulk semiconductor material, and one or more original semiconductor fins formed integrally with the substrate without any joints therebetween;
    creating a dielectric layer over open areas of the substrate adjacent the one or more original fins;
    creating first cladding over the dielectric layer adjacent each of the one or more original fins, wherein the first cladding has uniform sidewalls and comprises a semiconductor material sufficiently different from that of the one or more original fins to allow selective etching thereof; and
    selectively etching to remove the one or more original fins, resulting in a second semiconductor structure, wherein the first cladding forms second fins and the dielectric layer provides electrical isolation of the second fins from the substrate.

2. The method of claim 1, wherein creating the dielectric layer comprises:
    conformally blanketly depositing a dielectric layer over the first semiconductor structure; and
    recessing the dielectric layer.

3. The method of claim 1, wherein the first cladding comprises one of silicon and a semiconductor material comprising one or more periodic table elements from one or more of columns III, IV and V.

4. The method of claim 1, wherein the one or more original fins comprises a plurality of original fins, and wherein the second fins have a fin pitch of less than the plurality of original fins.

5. The method of claim 1, wherein the first semiconductor structure further comprises a hard mask over the one or more original fins, the method further comprising removing the hard mask prior to removing the one or more original fins.

6. The method of claim 1, further comprising:
    conformally blanketly depositing a second dielectric layer over the second structure;
    etching the second dielectric layer using a top surface of the second fins as an etch stop; and
    recessing the second dielectric layer down to a bottom surface of the second fins.

7. The method of claim 1, wherein the one or more original fins comprise silicon, and wherein the semiconductor material of the first cladding comprises one or more periodic table elements from one or more of columns III, IV and V.

8. The method of claim 7, wherein the semiconductor material of the first cladding comprises one of Ge, $Si_{1-x}Ge_x$, GaAs, InP, $In_{1-x}Ga_xAs$, $In_{1-x}Ga_xSb$, $In_xGa_{1-x}As_ySb_{1-y}$, $Al_xGa_{1-x}As_ySb_{1-y}$, InSb, InAs, GaP and GaSb, and wherein $0 > x \geq 1$ and $0 \geq y \geq 1$.

9. The method of claim 1, wherein creating the first cladding comprises epitaxially growing the first cladding.

10. The method of claim 1, wherein the one or more original fins has a sidewall crystal orientation of (100), and one of: (a) a top surface crystal orientation of (110) and a channel orientation of <110>; and (b) a top surface crystal orientation of (100) and a channel orientation of <100>.

11. The method of claim 1, further comprising:
    creating second cladding over the dielectric layer adjacent each of the second fins, wherein the second cladding has uniform sidewalls and comprises a semiconductor material sufficiently different from that of the second fins to allow selective etching thereof; and
    selectively etching to remove the second fins, resulting in a third semiconductor structure, wherein the second cladding forms third fins, each of the third fins having a uniform sidewall crystal orientation, and wherein the dielectric layer provides electrical isolation of the third fins from the substrate.

12. The method of claim 11, wherein the second cladding comprises one of silicon and a semiconductor material comprising one or more periodic table elements from one or more of columns III, IV and V.

13. The method of claim 12, wherein the second cladding comprises one of Ge, $Si_{1-x}Ge_x$, GaAs, InP, $In_{1-x}Ga_xAs$, $In_{1-x}Ga_xSb$, $In_xGa_{1-x}As_ySb_{1-y}$, $Al_xGa_{1-x}As_ySb_{1-y}$, InSb, GaP and GaSb, and wherein $0 \geq x \geq 1$ and $0 \leq y \leq 1$.

14. The method of claim 11, wherein the third fins have a fin pitch of less than the second fins.

15. The method of claim 11, further comprising:
    conformally blanketly depositing a third dielectric layer over the third semiconductor structure;
    etching the third dielectric layer using a top surface of the third fins as an etch stop; and
    recessing the third dielectric layer down to a bottom surface of the third fins.

16. The method of claim 11, wherein creating the second cladding comprises epitaxially growing the second cladding.

17. A method, comprising:
providing a first semiconductor structure, the first structure comprising a semiconductor substrate of a bulk semiconductor material, and one or more original semiconductor fins coupled to the substrate;
creating a dielectric layer over open areas of the substrate adjacent the one or more original fins, creating the dielectric layer comprising:
conformally blanketly depositing a dielectric layer over the first semiconductor structure; and
recessing the dielectric layer;
creating first cladding over the dielectric layer adjacent each of the one or more original fins, wherein the first cladding has uniform sidewalls and comprises a semiconductor material sufficiently different from that of the one or more original fins to allow selective etching thereof; and
selectively etching to remove the one or more original fins, resulting in a second semiconductor structure, wherein the first cladding forms second fins and the dielectric layer provides electrical isolation of the second fins from the substrate.

18. The method of claim 17, further comprising:
conformally blanketly depositing a second dielectric layer over the second structure;
etching the second dielectric layer using a top surface of the second fins as an etch stop; and
recessing the second dielectric layer down to a bottom surface of the second fins.

19. A method, comprising:
providing a first semiconductor structure, the first structure comprising a semiconductor substrate of a bulk semiconductor material, and one or more original semiconductor fins coupled to the substrate;
creating a dielectric layer over open areas of the substrate adjacent the one or more original fins;
creating first cladding over the dielectric layer adjacent each of the one or more original fins, wherein the first cladding has uniform sidewalls and comprises a semiconductor material sufficiently different from that of the one or more original fins to allow selective etching thereof;
selectively etching to remove the one or more original fins, resulting in a second semiconductor structure, wherein the first cladding forms second fins and the dielectric layer provides electrical isolation of the second fins from the substrate;
creating second cladding over the dielectric layer adjacent each of the second fins, wherein the second cladding has uniform sidewalls and comprises a semiconductor material sufficiently different from that of the second fins to allow selective etching thereof;
selectively etching to remove the second fins, resulting in a third semiconductor structure, wherein the second cladding forms third fins, each of the third fins having a uniform sidewall crystal orientation, and wherein the dielectric layer provides electrical isolation of the third fins from the substrate;
conformally blanketly depositing a third dielectric layer over the third semiconductor structure;
etching the third dielectric layer using a top surface of the third fins as an etch stop; and
recessing the third dielectric layer down to a bottom surface of the third fins.

* * * * *